United States Patent
Tejnil

(10) Patent No.: US 8,521,481 B2
(45) Date of Patent: Aug. 27, 2013

(54) METHOD, PROGRAM PRODUCT AND APPARATUS FOR MODELING RESIST DEVELOPMENT OF A LITHOGRAPHY PROCESS

(75) Inventor: Edita Tejnil, Cupertino, CA (US)

(73) Assignee: ASML Masktools B.V., Veldhoven (NL)

( * ) Notice: Subject to any disclaimer, the term of this patent is extended or adjusted under 35 U.S.C. 154(b) by 1071 days.

(21) Appl. No.: 11/896,292

(22) Filed: Aug. 30, 2007

(65) Prior Publication Data

US 2008/0059128 A1    Mar. 6, 2008

Related U.S. Application Data

(60) Provisional application No. 60/840,953, filed on Aug. 30, 2006.

(51) Int. Cl.
  *G06F 7/60*    (2006.01)
  *G06F 17/10*   (2006.01)
  *G06F 17/50*   (2006.01)
  *G03F 1/00*    (2006.01)

(52) U.S. Cl.
  USPC .................................... 703/2; 703/13; 430/5

(58) Field of Classification Search
  USPC ............................................ 703/2, 13; 430/5
  See application file for complete search history.

(56) References Cited

U.S. PATENT DOCUMENTS

| | | | | |
|---|---|---|---|---|
| 7,124,395 B2* | 10/2006 | Shi et al. | ........................... | 716/53 |
| 7,138,212 B2* | 11/2006 | Hsu et al. | ........................... | 430/5 |
| 7,175,940 B2* | 2/2007 | Laidig et al. | ....................... | 430/5 |
| 7,398,508 B2* | 7/2008 | Shi et al. | ........................... | 716/52 |
| 7,488,933 B2* | 2/2009 | Ye et al. | ...................... | 250/252.1 |
| 7,921,383 B1* | 4/2011 | Wei | .................................. | 716/54 |
| 2007/0282574 A1* | 12/2007 | Huang et al. | ....................... | 703/2 |

OTHER PUBLICATIONS

Poonawala et al, "OPC and PSM design using inverse lithography: A non-linear optimization approach", Mar. 20, 2006, SPIE Digital Library, vol. 6154, pp, 1-14.*

Xinhui Niu, "Deep Ultraviolet Lithography Simulator Tuning by Resist Profile Matching", May 1999, EUROPTO Conference on Lithography for Semiconductor Manufacturing, pp. 245-252.*

Shi, Xuelong, et al. "OPC model calibration for CPL patterning at extreme low k1." Photomask Technology. International Society for Optics and Photonics, 2004.*

Pistor, T.V., "A new Photoresist Simulator from Panoramic Technology", Panoramic Technology Inc., Berkeley, California, U.S.A.

* cited by examiner

*Primary Examiner* — Mary C Jacob
*Assistant Examiner* — Aniss Chad
(74) *Attorney, Agent, or Firm* — Pillsbury Winthrop Shaw Pittman LLP

(57) ABSTRACT

A method of generating a model for simulating the imaging performance of an optical imaging system. The method includes the steps of defining the optical imaging system and a process to be utilized by the optical imaging system; and defining a model equation representing the imaging performance of the optical imaging system and the process, where the model equation includes a resist performance component, and the resist performance component includes a non-linear model of the resist performance.

15 Claims, 5 Drawing Sheets

METHOD, PROGRAM PRODUCT AND APPARATUS FOR MODELING RESIST DEVELOPMENT OF A LITHOGRAPHY PROCESS

PRIORITY CLAIM

This application claims priority to Provisional Application Ser. No. 60/840,953, filed on Aug. 30, 2006, the contents of which are incorporated herein in its entirety.

TECHNICAL FIELD

This disclosure relates generally to lithographic simulation tools. More particularly, it relates to a method for modeling the resist development in a lithography process so as to allow for the generation of a more accurate model for simulating the imaging performance of an optical imaging system.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally >1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "optics;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. A critical dimension of a circuit can be defined as the smallest width of a line or hole or the smallest space between two lines or two holes. Thus, the CD determines the overall size and density of the designed circuit.

Due to an accuracy requirement for optical proximity correction (OPC) at very low k1 (<0.4), more accurate representation of the performance of the exposure tool in simulations has become critical to accommodate the reduction of device pattern dimensions. As is known, the modeling of complex optical imaging and patterning processes often relies on empirical models with adjustable parameters that have to be calibrated using measured data. Such empirical models are used in photolithography and advanced imaging applications, including optical proximity correction (OPC) of layouts in photolithography, post-OPC layout verification, die-to-database photomask pattern inspection, etc. The empirical models of the imaging process have adjustable parameters that are optimized, or "calibrated", using measured data. In other words, the adjustable parameters are adjusted until the simulated imaging result matches the actual imaging result (i.e., the measured data) within some predefined error criteria. In case of OPC in lithographic patterning, the calibration data may be, for example, CD SEM measurements of patterns from semiconductor wafers. In case of mask inspection, the calibration data may be, for example, images of the mask measured on the inspection tool.

Although physically based models of lithographic patterning are well understood, their use in modeling full-chip designs is limited by available computation time and resources. Consequently, less complicated and more efficient empirical patterning models are typically used in OPC applications. As noted, empirical models have adjustable parameters that are optimized, or "calibrated", using measured patterns and/or critical dimension (CD) information from semiconductor wafers patterned with the lithographic process of interest. Since each empirical model does not completely capture the physics of the patterning process, its usefulness depends on how well it can match the observed measurements and predict the process behavior.

Currently, in existing prior art imaging models, the resist performance is modeled by only considering the optical intensity at given points within the resist. This can be done, for example, by convolving the optical intensity with known curves, such as a Gaussian curve, so as to model the performance of the resist. However, this approach wholly neglects the non-linear effects of the resist, which are dependent, for example, on the pattern and resist type. As such, the current imaging model techniques do not accurately model the resist performance and thereby exhibit an inherent error with respect to modeling resist performance. As the design requirements continue to become more demanding, there is a continuing need for the simulation models to be more accurate.

Accordingly, there exists a need for a modeling process which considers and models actual resist performance so as to produce a simulation model capable of producing simulation results exhibiting increased accuracy relative to the actual imaging performance.

SUMMARY

In view of the foregoing deficiencies in the prior art imaging models, the present invention relates to a method of generating an imaging model which includes and considers the effects of the actual resist response. In particular, as noted in more detail below, the present invention models the resist component of the imaging model utilizing a non-linear function, which more accurately represents actual resist performance during the imaging process. As a result, a more accurate imaging model and more accurate imaging results are produced.

More specifically, the present invention relates to a method of generating a model for simulating the imaging performance of an optical imaging system. The method includes the steps of defining the optical imaging system and a process to be utilized by the optical imaging system; and defining a model equation representing the imaging performance of the optical imaging system and the process, where the model equation includes a resist performance component, and the resist performance component includes a non-linear model of the resist performance.

In addition, the present invention relates to a method of simulating the imaging performance of an optical imaging system. The method includes the steps of defining the optical imaging system and a process to be utilized by the optical imaging system; defining a model equation representing the imaging performance of the optical imaging system and the process, and processing a target pattern utilizing the model equation so as to generate a simulated imaging result, where the model equation includes resist performance component and the resist performance component includes a non-linear model of the resist performance.

As explained in more detail below, the method of the present invention provides significant advantages over the prior art. Most importantly, the present invention provides an imaging model which utilizes a non-linear function to represent the resist response. As a result, a more accurate imaging model is produced, which benefits all applications utilizing such simulation processes. For example, increased model accuracy results in improved OPC application and verification, which are important aspects of the mask design process.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as being replaced by the more general terms "mask," "substrate" and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from United States patents U.S. Pat. Nos. 5,296,891 and 5,523,193, which are incorporated herein by reference.

a programmable LCD array. An example of such a construction is given in United States patent U.S. Pat. No. 5,229,872, which is incorporated herein by reference.

The invention itself, together with further objects and advantages, can be better understood by reference to the following detailed description and the accompanying drawings.

DETAILED DESCRIPTION

As noted above, the present invention relates to a method of generating a model of an optical imaging system which incorporates a non-linear model of the resist performance. In general, the generation of the imaging model includes generating a function of position, hereinafter referred to as a "system pseudo intensity function" (SPIF), from the image intensity I(x,y,z), which reflects the non-linear performance of the resist. Once generated, the imaging model function can be thresholded to produce contours of the printed pattern that are desired for various applications, such as OPC treatment or verification.

Figure 1:
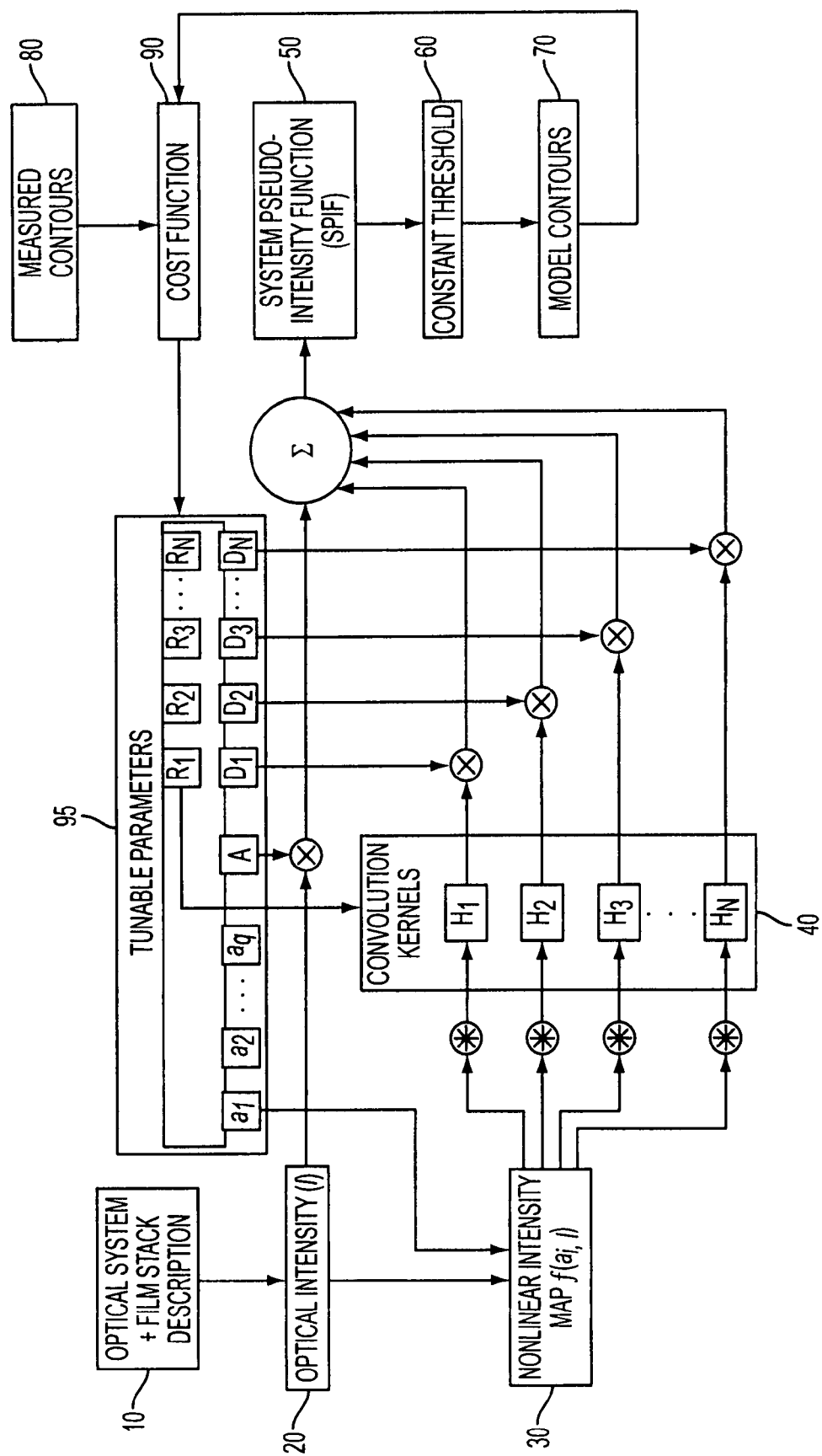
FIG. 1 illustrates a flow chart of an exemplary method of generating a model of an optical imaging system which incorporates a non-linear model of the resist performance in accordance with the present invention.

FIG. 1 illustrates a flow chart of an exemplary method of generating a model of an optical imaging system which incorporates a non-linear model of the resist performance in accordance with the present invention. The imaging model (also referred to herein as the model function) is produced from the image intensity using the following steps.

Referring to FIG. 1, the first step (Step 10) in the process is to define the optical lithography system and the process which is to be utilized (or modeled). The next step (Step 20) is to calculate an optical image intensity I(x,y,z) inside photoresist layer or in air (or in liquid when utilizing immersion lithography).

The next step (Step 30) is to apply a local nonlinear transform $J(x,y,z, a_1, a_2, \ldots, a_m) = f(I(x,y,z), a_1, a_2, \ldots, a_m)$ to the image intensity. The transform function $f$ is a nonlinear one-to-one map over the range from 0 to $I_{max}$ of the normalized intensity I. Here $I_{max}$ is the maximum image intensity and it is assumed that I is normalized to clear-field intensity of unity. The transform function $f$ is designed to generally have an "S" shape as the image intensity varies over the entire range from 0 to $I_{max}$. The shape of $f(I)$ vs. I is controlled with one or more adjustable parameters $a_i$.

Continuing, the next step in the process (Step 40) is to convolve the transformed intensity $J=f(I)$ with a series of convolution functions $H_n(x,y,z)$, also referred to as "diffusion kernels", to produce a correction term $\Sigma_n D_n H_n(x,y,z)*f(I(x,y,z))$, where $D_n$ are adjustable parameters and * denotes convolution. Thereafter, a correction term is added to the intensity I(x,y,z) to produce the "system pseudo intensity function" (SPIF), which is defined as:

$$SPIF(x,y,z)=AI(x,y,z)+\Sigma_n D_n H_n(x,y,z)*f(I(x,y,z)),$$

where A is an adjustable parameter that controls the relative weight of the main term and the intensity correction term. One alternative for generating the system pseudo intensity function is to add the correction term to the transformed intensity $f(I(x,y,z))$ to obtain:

$$SPIF(x,y,z)=Af(I(x,y,z))+\Sigma_n D_n H_n(x,y,z)*f(I(x,y,z)).$$

It is also possible to add an adjustable constant offset B term to the optical intensity function to obtain:

$$SPIF(x,y,z)=A(I(x,y,z)+B)+\Sigma_n D_n H_n(x,y,z)*f(I(x,y,z)+B), \text{ or}$$

$$SPIF(x,y,z)=Af(I(x,y,z)+B)+\Sigma_n D_n H_n(x,y,z)*f(I(x,y,z)+B),$$

where B can be set to 0 if desired. The resulting function SPIF(x,y,z) (Step 50) represents the effective intensity with resist and/or etch effects for the given lithographic system and process defined in Step 10. In other words, the function SPIF(x,y,z) represents the simulated performance of the imaging system for the given lithography system and process, and reflects the non-linear performance of the resist in the imaging result.

It is noted that when a constant threshold (Step 0) is applied to the SPIF(x,y,z) to simulate the resist contours, the model will produce position-dependent adjustment of the contours (Step 70) relative to contours of the aerial image. This adjustment includes the non-linear resist effects.

It is also noted that during the calibration process of the imaging model, the model contours associated with a target/calibration pattern resulting from thresholding the SPIF(x,y,z) function are compared against measured contours (Step 80), which are actual images produced by imaging the target/calibration pattern utilizing the given lithography system and process, and the differences between simulated contours and the actual contours are utilized to adjust a cost function (Step 90), which adjusts tunable parameters (Step 95) such that the results of the simulated image correspond with the actual imaging results within some predefined error criteria.

It is further noted that variations of the foregoing method for generating the model detailed above are possible. The following discussion sets forth some possible variations, however, other variations are also possible.

As a first variation, it is possible to perform the convolution with the "diffusion" terms before applying the non-linear transform, which results in the SPIF function being defined as:

$$SPIF(x,y,z)=A(I(x,y,z)+B)+f(\Sigma_n D_n H_n(x,y,z)*(I(x,y,z)+B)), \text{ or}$$

$$SPIF(x,y,z)=Af(I(x,y,z)+B)+f(\Sigma_n D_n H_n(x,y,z)*(I(x,y,z)+B)).$$

Another possible variation is to apply a second non-linear transform $J'(x,y,z, a_1', a_2', \ldots, a_m') = f'(I(x,y,z), a_1', a_2', \ldots, a_m')$ either after Step 40 or after Step 50 in the method disclosed above. This results in four possible versions of the imaging model:

$$SPIF(x,y,z)=A(I(x,y,z)+B)+f'(\Sigma_n D_n H_n(x,y,z)*f(I(x,y,z)+B)), \text{ or}$$

$$SPIF(x,y,z)=Af(I(x,y,z)+B)+f'(\Sigma_n D_n H_n(x,y,z)*f(I(x,y,z)+B)), \text{ or}$$

$$SPIF(x,y,z)=Af'(I(x,y,z))+f'(\Sigma_n D_n H_n(x,y,z)*f(I(x,y,z)+B)), \text{ or}$$

$$SPIF(x,y,z)=Af'(I(x,y,z)))+f'(\Sigma_n D_n H_n(x,y,z)*f(I(x,y,z)+B)).$$

In another variation, the correction term is replaced with another term with a convolution taken to the $N^{th}$ power. As a result, the correction term becomes:

$$\Sigma_n D'_n (H_n(x,y,z)*f(I(x,y,z)))^N.$$

In yet another variation, the correction term is replaced with another term with an absolute value of the convolution taken to the $N^{th}$ power. As a result, the correction term becomes: $\Sigma_n D''_n |H_n(x,y,z)*f(I(x,y,z))|^N$.

In yet another variation, the image intensity I(x,y,z) in the model above is replaced with an effective intensity $I_{eff}(x,y,z)$ that itself contains a series of squared and unsquared convolution correction terms. Specifically, $$I_{eff}(x,y,z)=I(x,y,z)+\Sigma_k Y_k U_k(x,y,z)*M(x,y,z)+\Sigma_l Z_l |S_l(x,y,z)*M(x,y,z)|^2,$$

where M(x,y,z) represents the complex representation of the pattern of the mask that is being imaged; $Y_k$ and $Z_l$ are adjustable parameters for the squared and unsquared intensity correction terms; and $U_k(x,y,z)$ and $S_l(x,y,z)$ are the squared and unsquared convolution functions, respectively.

It is further noted that the convolution functions $H_n(x,y,z)$ should be spatially confined and decay to 0 for large values of the spatial coordinates x, y, and z to produce valid results. Furthermore, the Fourier transforms of the convolution functions should be substantially non-zero only over a limited range of spatial frequencies. For example, $H_n(x,y,z)$ may be Gaussian functions of different widths. The convolution functions can also be orthogonal functions, such as, but not limited to, the Hermite-Gaussian functions, Zernike polynomials, Fourier transforms of Zernike polynomials, Bessel functions, etc. Combinations of different orthogonal and non-orthogonal functions with the desired spatial and spatial frequency behavior may also be utilized.

A suitable nonlinear transform $f$ (or $f'$) utilized to operate on the normalized intensity I may be, for example, an "S" shaped curve, also referred to as a sigmoid function. Its value at zero intensity corresponds to "reactivity" $f_{min}$ of the unexposed resist, while at the normalized intensity of unity $f(I=1)$ corresponds to resist "reactivity" under clear field exposure. Since the normalized intensity can exceed unity, owing to localized image interference, the transform $f(I)$ is preferably defined for input values up to the maximum intensity $I_{max}$. For very large intensities the transform $f(I)$ will reach a saturation value that corresponds to the maximum reactivity of the resist $f_{max}$. Sigmoid functions include, for example, but not limited to, those based on the logistic function, the error function, and the arctangent function.

Since in some applications only the resist pattern contour extracted from the model function is important, the nonlinear transform $f$ (or $f'$) may be chosen such that the model fits the measured data only for a relatively small range of intensities. The important input intensity range for the transform $f(I)$ is near the threshold intensity $I_{threshold}$ that was used to expose the patterns in the calibration data set. In this case, an $N^{th}$-order polynomial series may be a suitable nonlinear transform function.

Figure 2:
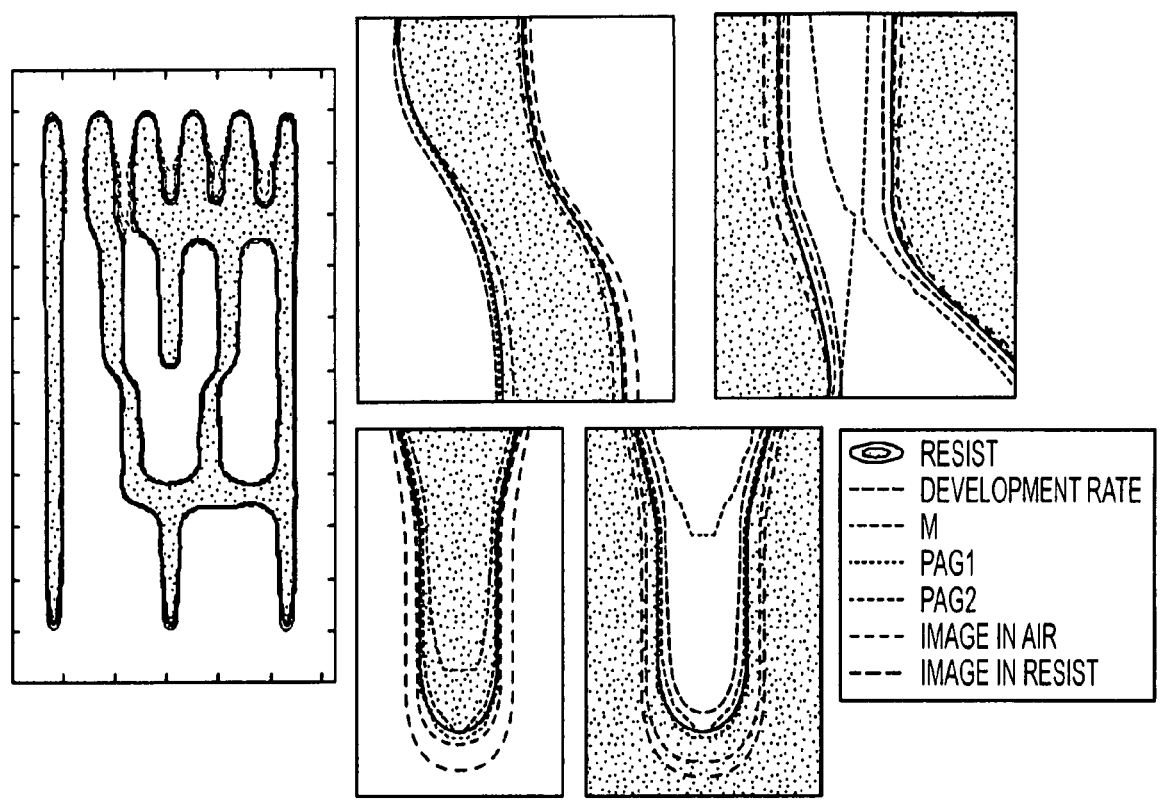
FIG. 2 illustrates a comparison of simulated contours for a multi-pitch line pattern.

In developing the model of the present invention which incorporates the non-linear response of the resist, the inventor performed a simulation study of resist patterning that employed a physically based model of the photolithography patterning process. The simulation study compared the final printed resist contours to image contours as well as to contours of several different functions that describe the photoresist properties during the exposure and development process. Specifically, printed resist contours were compared to the aerial image, the image in resist, the photoacid generator concentration before (PAG1) and after post-exposure bake (PAG2), the normalized concentration of reactive resist sites (M), and the resist development rate. It was found that the printed resist contours closely matched the contours of the concentration of reactive resist sites M for a variety of pattern feature types. The feature types included lines, spaces, resist elbows, elbow-shaped resist trenches, as well as more complex patterns. Some example contours comparisons are given in FIG. 2.

Figure 3:
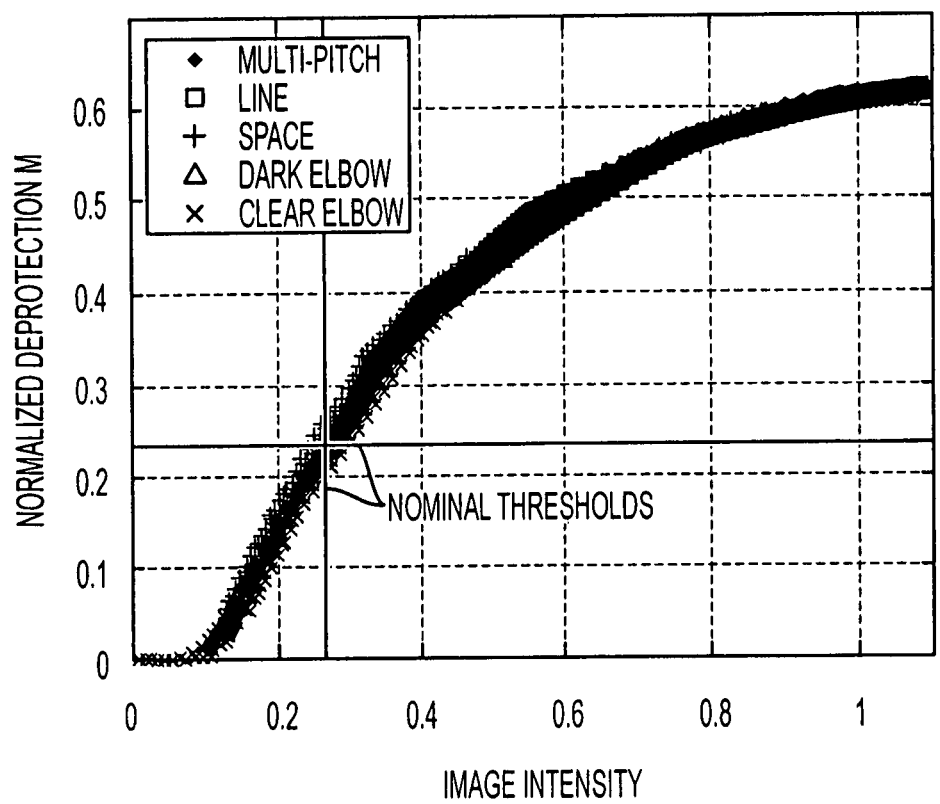
FIG. 3 illustrates a plot of the reactive sites concentration vs. the aerial image intensity for different patterns.

Next, the variation of the reactive sites concentration vs. the image intensity was analyzed. The plot of the reactive sites concentration vs. the aerial image intensity for all spatial locations in the patterns used in the study is shown in FIG. 3. As shown, the plot has a well-defined shape that effectively describes the nonlinear resist response to intensity. The resist acid diffusion effects are apparent in the spread of the points at a given intensity in FIG. 3.

As noted above, a function with adjustable parameters that describes the shape of the curve in FIG. 3 can be used as the nonlinear transform $J(x,y,z)=f(I(x,y,z))$ in the imaging model of the present invention. Such a transform captures the nonlinear resist response to the intensity, while the convolution terms in the model describe the non-localized "diffusion-like" effects in the resist response. It is noted that because the model parameters are adjustable, the model can be utilized to describe a variety of different resist patterning processes.

As mentioned above, the method of the present invention provides significant advantages over the prior art. Most importantly, the imaging model described herein represents a novel approach to OPC model generation. Since the model uses the input aerial image and includes simplified physical characteristics of the resist patterning process, its ability to predict contours of patterns not included in the calibration data exceeds that of other prior art models based primarily on convolution kernels or on variable thresholds. Moreover, the formulation of the model advantageously does not result in significant computational overhead during the OPC generation or verification compared to prior art approaches.

Variations of the embodiment described above are also possible. For example, some examples of S-shaped curves that may be suitable for the empirical resist function are given below. In these examples, the adjustable parameters include the upper and lower asymptotes, $f_{min}$ and $f_{max}$, respectively, the approximate position where the curve is increasing $I_{increase}$, the parameter that controls the rate of increase of the function $a_{rate}$, and the parameter that changes the shape of the curve, $a_{shape}$. Among these examples, the generalized logistics function appears to be the most flexible. The examples are:

sigmoid function based on the error function:

$$f(I)=(f_{max}+f_{min})/2+(f_{max}-f_{min})/2\ erf(a_{rate}(I-I_{increase}));$$

sigmoid function based on the arctangent function:

$$f(I)=(f_{max}+f_{min})/2+(f_{max}-f_{min})/\pi a\ \tan(a_{rate}(I-I_{increase}));$$

logistic sigmoid function:

$$f(I)=f_{min}+(f_{max}-f_{min})/(1+\exp(-a_{rate}(I-I_{increase})));$$
and generalized logistic sigmoid function:

$$f(I)=f_{min}+(f_{max}-f_{min})/(1+a_{shape}*\exp(-a_{rate}(I-I_{increase})))^{1/ashape}.$$

Figure 4:
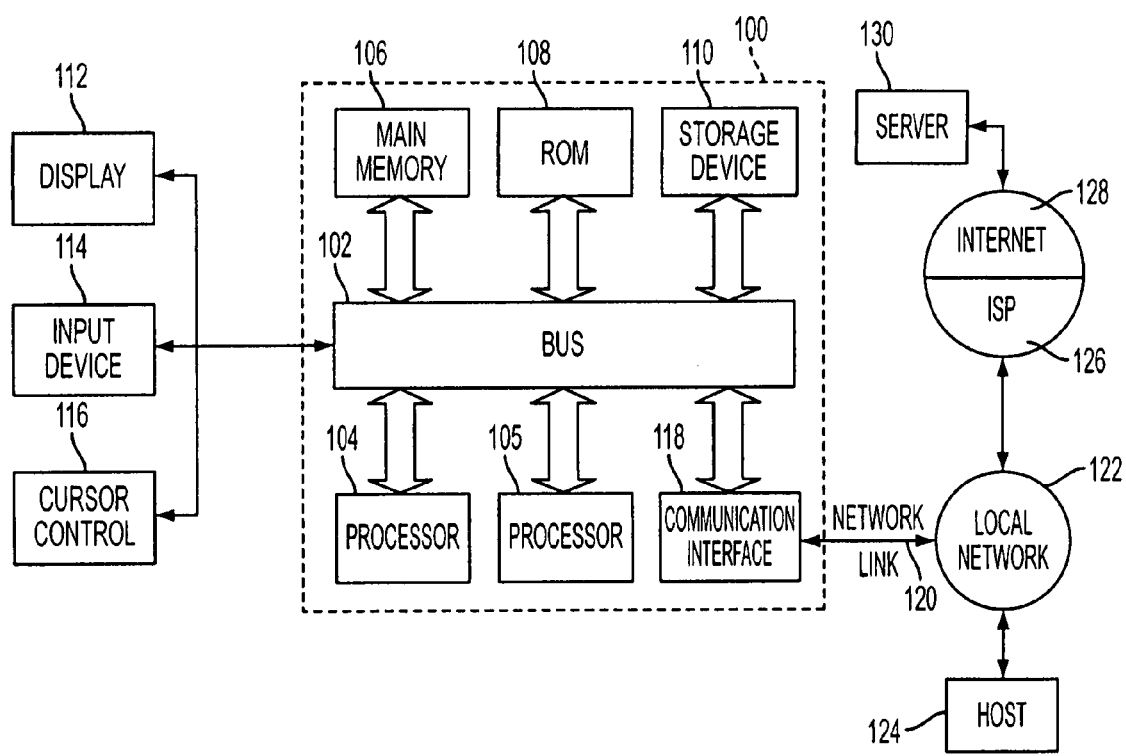
FIG. 4 is a block diagram that illustrates a computer system 100 which can assist in the generation of a model of an optical imaging system which incorporates a non-linear model of the resist performance in accordance with the present invention.

FIG. 4 is a block diagram that illustrates a computer system 100 which can assist in the generation of a model of an optical imaging system which incorporates a non-linear model of the resist performance in accordance with the present invention. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

Determination and calibration of the imaging model may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 (and, optionally, to co-processor 105) for execution. Such a medium may take many forms, including but not limited to, non-volatile media, and volatile media. Non-volatile media include, for example, optical or magnetic disks, such as storage device 110. Volatile media include dynamic memory, such as main memory 106. Common forms of computer-readable media include, for example, a floppy disk, a flexible disk, hard disk, magnetic tape, any other magnetic medium, a CD-ROM, DVD, any other optical medium, a RAM, a PROM, and EPROM, a FLASH-EPROM, any other memory chip or cartridge, or any other medium from which a computer can read.

One or more sequences can be involved in providing one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the determination of the calibration test patterns. The received code may be executed by processor 104 as it is received, and/or stored in storage device 110, or other non-volatile storage for later execution. In this manner, computer system 100 may obtain application code in the form of a carrier wave. generating a model of an optical imaging system which incorporates a non-linear model of the resist performance in accordance with the present invention.

Figure 5:
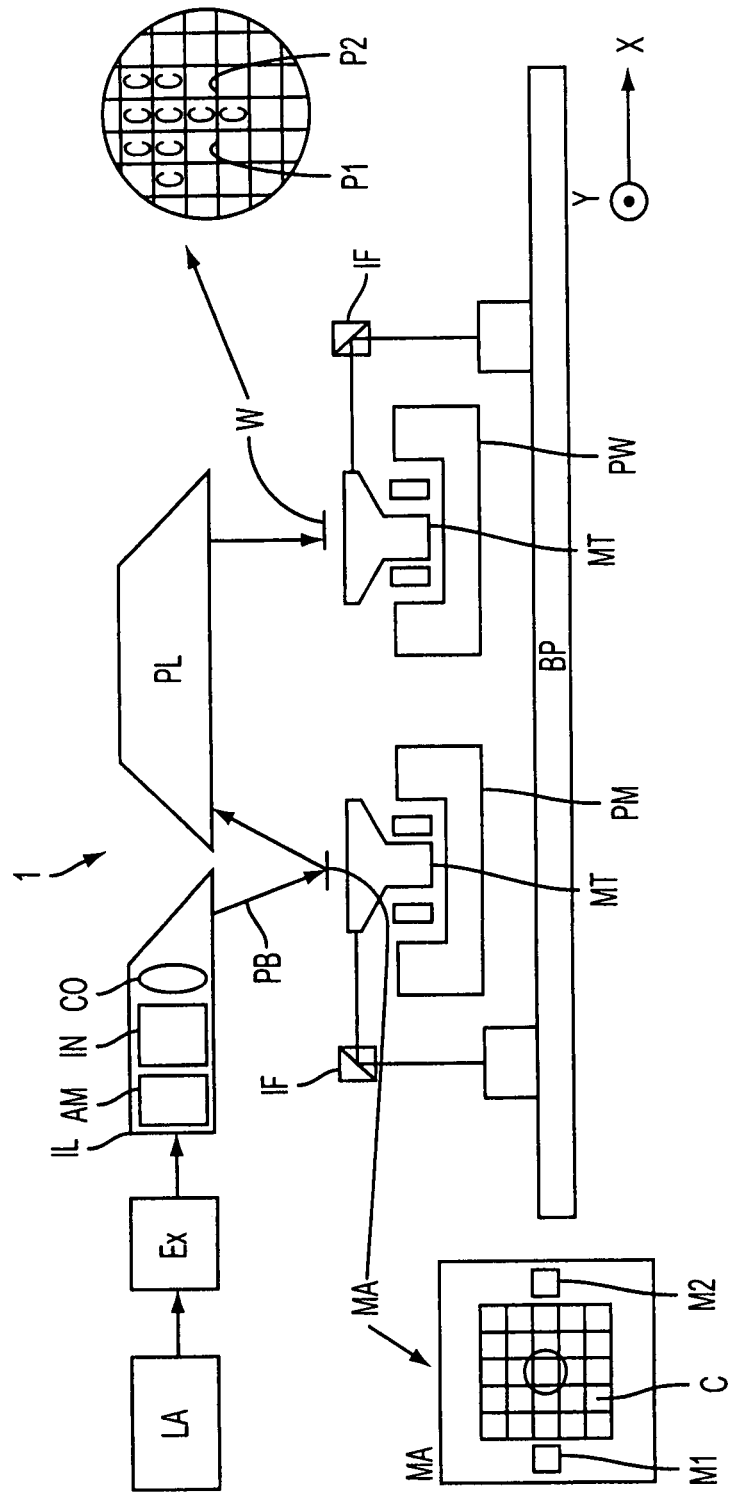
FIG. 5 schematically depicts an exemplary lithographic projection apparatus that could be the basis of the imaging model to be developed and calibrated in accordance with the process of the present invention.

FIG. 5 schematically depicts an exemplary lithographic projection apparatus that could be the basis of the imaging model to be developed and calibrated in accordance with the process of the present invention. The apparatus comprises:
   a radiation system Ex, IL, for supplying a projection beam PB of radiation. In this particular case, the radiation system also comprises a radiation source LA;
   a first object table (mask table) MT provided with a mask holder for holding a mask MA (e.g., a reticle), and connected to first positioning means for accurately positioning the mask with respect to item PL;
   a second object table (substrate table) WT provided with a substrate holder for holding a substrate W (e.g., a resist-coated silicon wafer), and connected to second positioning means for accurately positioning the substrate with respect to item PL;
   a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as a-outer and a-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 5 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 5. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the apparatus disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of generating a model for simulating the imaging performance of an optical imaging system, said method comprising the steps of:

defining said optical imaging system and a process to be utilized by said optical imaging system;

defining a three-dimensional model equation comprising tunable parameters, said model equation representing the imaging performance of said optical imaging system and said process, and said model equation including a non-linear resist performance component, wherein the resist performance component is a combination of an optical image intensity and a set of diffusion kernels corresponding to variation of one or more physical characteristics of a resist patterning process with respect to variation in image intensity;

simulating resist contours using the defined model equation;

comparing the simulated resist contours with measured resist contours to produce a correction term; and adjusting the tunable parameters of the model equation using the correction term to generate the model for simulating the imaging performance of the optical imaging system that provides improved matching of the simulated resist contours with the measured resist contours, wherein the step of defining the three-dimensional model equation includes producing a system pseudo intensity function (SPIF) having three spatial dimensions by convolving the set of diffusion kernels representing the optical imaging system with a transformed non-linear intensity map.

2. The method of generating a model for simulating the imaging performance of an optical imaging system according to claim 1, wherein said model equation includes a transform function comprising respective local image intensity transformations corresponding to each image intensity value lying within a range of zero image intensity to a maximum image intensity.

3. The method of generating a model for simulating the imaging performance of an optical imaging system according to claim 2, wherein said transform function is selected from the group consisting of a sigmoid function, a logistic sigmoid function and a generalized logistic sigmoid function.

4. The method of claim 1, wherein the step of defining the model equation further includes:

thresholding the SPIF to simulate resist contours.

5. The method of claim 1, wherein the one or more physical characteristics of the resist patterning process include: photoacid generator concentration before post-exposure bake, photoacid generator concentration after post-exposure bake, normalized concentration of reactive resist sites, and resist development rate.

6. A method of simulating the imaging performance of an optical imaging system, said method comprising the steps of:

defining said optical imaging system and a process to be utilized by said optical imaging system;

defining a three-dimensional model equation comprising tunable parameters, said model equation representing the imaging performance of said optical imaging system and said process, and said model equation including a non-linear resist performance component, wherein the resist performance component is a combination of an optical image intensity and a set of diffusion kernels corresponding to variation of one or more physical characteristics of a resist patterning process with respect to variation of image intensity;

simulating resist contours using the defined model equation;

comparing the simulated resist contours with measured resist contours to produce a correction term;

adjusting the tunable parameters of the model equation using the correction term to generate a model for simulating the imaging performance of the optical imaging system that provides improved matching of the simulated resist contours with the measured resist contours; and utilizing the generated model in processing a target pattern, wherein the step of defining the model equation includes producing a system pseudo intensity function (SPIF) having three spatial dimensions by convolving the set of diffusion kernels representing the optical imaging system with a transformed non-linear intensity map.

7. The method of simulating the imaging performance of an optical imaging system according to claim 6, wherein said model equation includes a transform function comprising respective local image intensity transformations corresponding to each image intensity value lying within a range of zero image intensity to a maximum image intensity.

8. The method of simulating the imaging performance of an optical imaging system according to claim 7, wherein said transform function is selected from the group consisting of a sigmoid function, a logistic sigmoid function and a generalized logistic sigmoid function.

9. The method of claim 6, wherein the method of defining the model equation further includes:
thresholding the SPIF to simulate resist contours.

10. The method of claim 6, wherein the one or more physical characteristics of the resist patterning process include: photoacid generator concentration before post-exposure bake, photoacid generated concentration after post-exposure bake, normalized concetration of reactive resist sites, and resist development rate.

11. A computer program product comprising a non-transitory computer readable medium storing a computer program for generating a model for simulating the imaging performance of an optical imaging system, the computer program, when executed, causing a computer to perform the steps of:

defining said optical imaging system and a process to be utilized by said optical imaging system;

defining a three-dimensional model equation comprising tunable parameters, said model equation representing the imaging performance of said optical imaging system and said process, and said model equation including a non-linear resist performance component, wherein the resist performance component is a combination of an optical image intensity and a set of diffusion kernels corresponding to variation of one or more physical characteristics of a resist patterning process with respect to variation of image intensity;

simulating resist contours using the defined model equation;

comparing the simulated resist contours with measured resist contours to produce a correction term; and adjusting the tunable parameters of the model equation using the correction term to generate the model for simulating the imaging performance of the optical imaging system that provides improved matching of the simulated resist contours with the measured resist contours, wherein the step of defining the model equation includes producing a system pseudo intensity function (SPIF) having three spatial dimensions by convolving the set of diffusion kernels representing the optical imaging system with a transformed non-linear intensity map.

12. The computer program product according to claim 11, wherein said model equation includes a transform function comprising respective local image intensity transformations corresponding to each image intensity value lying within a range of zero image intensity to a maximum image intensity.

13. The computer program product according to claim 12, wherein said transform function is selected from the group consisting of a sigmoid function, a logistic sigmoid function and a generalized logistic sigmoid function.

14. The computer program product of claim 11, wherein the step of defining the model equation further includes:
thresholding the SPIF to simulate resist contours. post-exposure bake, photoacid generator concentration after post-exposure bake, normalized concentration of reactive resist sites, and resist development rate.

15. The computer program product of claim 11, wherein the one or more physical characteristics of the resist patterning process include: photoacid generator concentration before post-exposure bake, photoacid generator concentration after post-exposure bake, normalized concentration of reactive resist sites, and resist development rate.

* * * * *